(12) United States Patent
Matsumoto et al.

(10) Patent No.: US 8,011,315 B2
(45) Date of Patent: Sep. 6, 2011

(54) THIN FILM FORMING APPARATUS

(75) Inventors: Takafumi Matsumoto, Kanagawa (JP); Shun Mikami, Kanagawa (JP); Kouichi Hanzawa, Kanagawa (JP); Mineharu Moriya, Kanagawa (JP); Hideyuki Odagi, Kanagawa (JP); Tetsuya Shimada, Kanagawa (JP); Masashi Kubo, Kanagawa (JP); Susumu Ikeda, Kanagawa (JP)

(73) Assignee: ULVAC, Inc., Kanagawa (JP)

( * ) Notice: Subject to any disclaimer, the term of this patent is extended or adjusted under 35 U.S.C. 154(b) by 983 days.

(21) Appl. No.: 10/588,507

(22) PCT Filed: Feb. 10, 2005

(86) PCT No.: PCT/JP2005/002050
§ 371 (c)(1),
(2), (4) Date: Oct. 27, 2007

(87) PCT Pub. No.: WO2005/075701
PCT Pub. Date: Aug. 18, 2005

(65) Prior Publication Data
US 2008/0141943 A1    Jun. 19, 2008

(30) Foreign Application Priority Data
Feb. 10, 2004    (JP) .................................. 2004-033501

(51) Int. Cl.
*B05C 11/02*    (2006.01)
(52) U.S. Cl. .............................. 118/52; 118/728; 269/21
(58) Field of Classification Search .................. 118/728, 118/52; 269/21
See application file for complete search history.

(56) References Cited

U.S. PATENT DOCUMENTS

| | | | |
|---|---|---|---|
| 3,977,806 A * | 8/1976 | Kinoshita | 408/141 |
| 4,718,681 A * | 1/1988 | Kakehi et al. | 279/106 |
| 4,771,730 A * | 9/1988 | Tezuka | 118/723 E |
| 5,224,809 A * | 7/1993 | Maydan et al. | 414/217 |
| 5,421,979 A * | 6/1995 | Stevenson | 204/298.25 |
| 6,231,732 B1 | 5/2001 | Hollars et al. | |
| 2002/0064450 A1* | 5/2002 | Coomer et al. | 414/939 |
| 2002/0079057 A1* | 6/2002 | Yoshioka et al. | 156/345.31 |

FOREIGN PATENT DOCUMENTS

| | | |
|---|---|---|
| EP | 0 502 412 A1 | 9/1992 |
| JP | 02-106036 A | 4/1990 |
| JP | 04-014222 A | 1/1992 |
| JP | 4-80734 B2 | 12/1992 |
| JP | 07-145481 A | 6/1995 |

* cited by examiner

*Primary Examiner* — Dah-Wei D Yuan
*Assistant Examiner* — Albert Hilton
(74) *Attorney, Agent, or Firm* — Arent Fox LLP

(57) ABSTRACT

A thin film forming apparatus such that a substrate can be easily fixed/removed to/from the outer circumferential surface of a drum type substrate holder through a simple arrangement.

The drum type substrate holder (5) is supported in a horizontal posture rotatably about a horizontal rotational shaft in a film deposition chamber A jig (13) holding a substrate (12) fixedly is transferred by an arm horizontally onto the outer circumferential surface of the drum type substrate holder (5), and an end part (13*b*) of the substrate fixing jig (13) can be secured by a securing device (14) provided at the corner part (5*a*) of the outer circumferential surface of the drum type substrate holder (5).

15 Claims, 7 Drawing Sheets

THIN FILM FORMING APPARATUS

CROSS-REFERENCE TO RELATED APPLICATION

This application is a National Stage entry of International Application No. PCT/JP2005/002050, filed Feb. 10, 2005, the entire specification claims and drawings of which are incorporated herewith by reference.

TECHNICAL FIELD

The present invention relates to a thin film forming apparatus to form a multi-layered thin film on a substrate by film forming means which is placed opposed to an outer circumferential surface of a tubular drum type substrate holder, while the drum type substrate holder which holds the substrate onto the outer circumferential surface is being rotated.

BACKGROUND ART

Conventionally a so-called carousel type sputtering apparatus is known which forms a multi-layered thin film on each of a plurality of substrates by sputtering a plurality of targets which are placed opposed to an outer circumferential surface of a polygonal or cylindrical drum type substrate holder, while the drum type substrate holder which holds the substrates onto the outer circumferential surface is being rotated (see Japanese Patent Laid-Open No. 2001-234338, for example).

In a carousel type sputtering apparatus, such as that described in the above patent No. 2001-234338, a plurality of substrates need to be fixed onto an outer circumferential surface of a drum type substrate holder before a film forming process is started, and the plurality of substrates need to be removed from the outer circumferential surface of the drum type substrate holder after the film forming process is completed.

In such a carousel type sputtering apparatus, a pressure in a vacuum chamber often needs to be recovered to an atmospheric level to remove the substrate manually.

It requires a long evacuation time, and since it is not automatically performed, in some cases the productivity cannot be improved.

Thus, another carousel type sputtering apparatus is known which includes a film forming chamber, a spare chamber separated from the film forming chamber by a valve (gate valve), and a drum type substrate holder which is movably installed between the film forming chamber and the spare chamber, so that a plurality of substrates are fixed onto an outer circumferential surface of the drum type substrate holder in the spare chamber, and the drum type substrate holder is moved to the film forming chamber to form a film, and after a film is formed, the drum type substrate holder is moved back to the spare chamber to exchange the substrates (see Japanese Patent Laid-Open No. 2001-185774, for example).

However, the carousel type sputtering apparatus, such as that described in the above patent No. 2001-185774 further includes: moving means to move a drum type substrate holder from a film forming chamber to a spare chamber to exchange substrates; and a spare chamber, and this makes the configuration of the apparatus complicated and larger, which should be improved.

Further, in the carousel type sputtering apparatus, such as that described in the above patent No. 2001-185774, the action to remove a substrate on which a film is formed at an outer circumferential surface of a drum type substrate holder in a spare chamber, and the action to fix a new substrate onto the outer circumferential surface of the drum type substrate holder are generally performed manually under atmospheric pressure, which should be improved in terms of working efficiency.

The present invention is accomplished in view of the above problems, and it is an object of the present invention to provide a thin film forming apparatus in which the action to fix a substrate onto an outer circumferential surface of a drum type substrate holder and the action to remove the substrate from the outer circumferential surface of the drum type substrate holder are performed through a simple arrangement, and also under vacuum with high efficiency.

DISCLOSURE OF THE INVENTION

To accomplish the above object, the present invention provides a thin film forming apparatus, and the thin film forming apparatus according to claim 1 of the present invention is configured to form a thin film by film forming means on each of a plurality of substrates held on an outer circumferential surface of a substrate holder that is rotatable about a rotating shaft, while the substrate holder is being rotated in an evacuatable chamber, the apparatus is characterized in that it comprises: transferring to/from means to transfer one of a substrate itself or a substrate fixing jig fixedly holding a substrate or a plurality of substrates that is to be removably secured onto the outer circumferential surface of the substrate holder to/from the substrate holder in the evacuatable chamber; and securing means to releasably secure the substrate itself or the substrate fixing jig transferred by the transferring to/from means onto the outer circumferential surface of the substrate holder.

The thin film forming apparatus according to claim 2 of the present invention is further configured so that the substrate holder is installed rotatably about a horizontal rotating shaft, and the transferring to/from means transfers one of the substrate fixing jig and the substrate itself in a horizontal direction.

The thin film forming apparatus according to claim 3 of the present invention is further configured so that the transferring to/from means transfers one of the substrate fixing jig and the substrate itself in an axial direction of the rotating shaft.

The thin film forming apparatus according to claim 4 of the present invention is further configured so that the transferring to/from means transfers one of the substrate fixing jig and the substrate itself in a direction parallel to the outer circumferential surface of the substrate holder.

The thin film forming apparatus according to claim 5 of the present invention is further configured so that both the transferring to/from action by the transferring to/from means and the securing action by the securing means are performed in a depressurized environment.

The thin film forming apparatus according to claim 6 of the present invention is characterized in that the releasing action by the securing means is controlled by an electrical signal.

The thin film forming apparatus according to claim 7 of the present invention is characterized in that the securing means has a mechanism to hold one of the substrate fixing jig and the substrate itself by pressing with retaining means, and a mechanism to release one of the substrate fixing jig and the substrate itself from the holding by compressing the retaining means by a drive unit mounted outside of the evacuatable chamber or a drive unit mounted inside of the substrate holder.

The thin film forming apparatus according to claim 8 of the present invention is characterized in that the securing means is configured to secure the substrate fixing jig by magnetic force.

The thin film forming apparatus according to claim 9 of the present invention is characterized in that the transferring to/from means is installed in a transferring chamber which is connected to the evacuatable chamber via a valve, and the transferring to/from chamber is evacuatable.

The thin film forming apparatus according to claim 10 of the present invention is characterized in that it further includes a load/unload chamber which is connected to the transferring chamber via a valve, and the load/unload chamber is evacuatable.

The thin film forming apparatus according to claim 11 of the present invention is characterized in that the film forming means is one of sputtering means, deposition means, and CVD means, or a combination of these means.

The thin film forming apparatus according to claim 12 of the present inventions characterized in that one of a reaction gas supplying means to supply a reaction gas, plasma exposing means to expose plasma, ion irradiating means to irradiate ions, and etching means to etch a portion of the thin film, or a combination of these means is applicable to the thin film formed by the film forming means.

According to the present invention, the substrate is fixed onto and removed from the drum type substrate holder automatically, and so easily.

The easy fixing and removing improves productivity.

Since the substrates are able to be exchanged in a depressurized atmosphere, contamination of the substrates is prevented and the time for evacuation is shortened, leading in tact time reduction.

Also, in one embodiment of the present invention, the drum type substrate holder is installed in a horizontal posture, which allows the substrate or the substrate fixing jig to be moved in a horizontal direction for exchanging.

The horizontal movement allows a horizontal transfer robot to be used, and the robot does not need a holding function for the substrate or the jig, resulting in a simple configuration robot.

This makes the transferring chamber smaller compared to that in an apparatus in which a substrate is transferred with being held vertically, resulting in a compact apparatus.

In another embodiment of the present invention, a substrate is fixed to and removed from the outer circumferential surface of a substrate holder together with a substrate fixing jig to which the substrate is fixedly held, resulting in a simple configuration.

A plurality of substrates are fixed to and removed from the outer circumferential surface of a substrate holder together with a substrate fixing jig to which the plurality of substrate are fixedly held, which improves the working efficiency and shortens the time to exchange the substrates.

DESCRIPTION OF SYMBOLS

Figure 1:
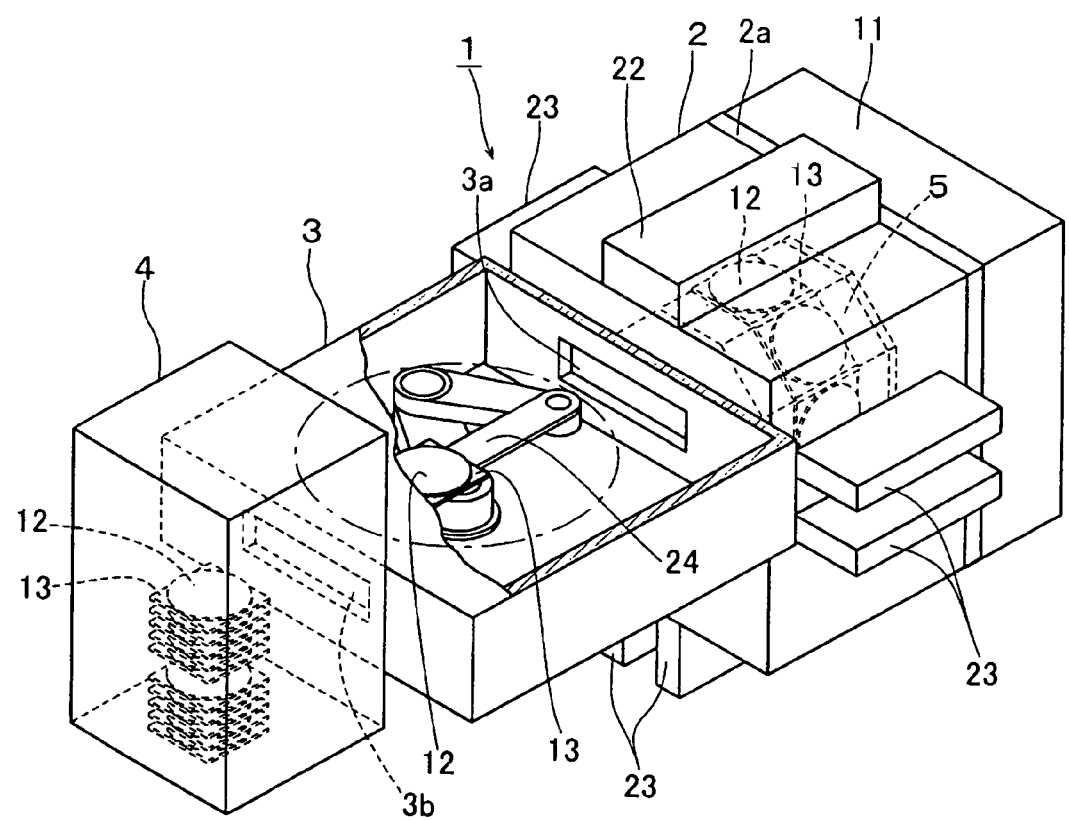
FIG. 1 is a partially cutaway perspective view to show a thin film forming apparatus of a first embodiment according to the present invention.

1 This film forming apparatus
2 Film forming chamber (vacuum container)
3 Transferring chamber
4 Storing and taking out chamber
5 Drum type substrate holder (substrate holder)
6 Rotating shaft
12 Substrate
13 Substrate fixing jig
14 Securing device (securing means)
16, 32, 36 Upper securing member
17, 30, 35, 37, 61 Lower securing member
19, 33 Cylinder drive unit
21 Hold-down shaft
24 Arm (transferring to/from means)
70 Guiding mechanism
71, 75 Guide rail
72, 73 Projected portion
77 Guiding section

BEST MODE FOR CARRYING OUT THE INVENTION

Now, the present invention will be explained with reference to the accompanying drawings.

Embodiment 1

FIG. 1 is a perspective view to show a thin film forming apparatus of a first embodiment according to the present invention, and the thin film forming apparatus of the embodiment is a carousel type sputtering apparatus to form films repeatedly on substrates which are held on each outer circumferential surface of a polygonal drum type substrate holder.

The thin film forming apparatus 1 includes a film forming chamber 2, a transferring chamber 3, and a load/unload chamber 4, and the film forming chamber 2 and the transferring chamber 3 are coupled via an opening 3a which is provided with a gate valve (not shown). The transferring chamber 3 and the load/unload chamber 4 are also coupled via an opening 3b which is provided with a gate valve (not shown). Each of the film forming chamber 2, the transferring chamber 3 and the load/unload chamber 4 has evacuating means (not shown).

Figure 2:
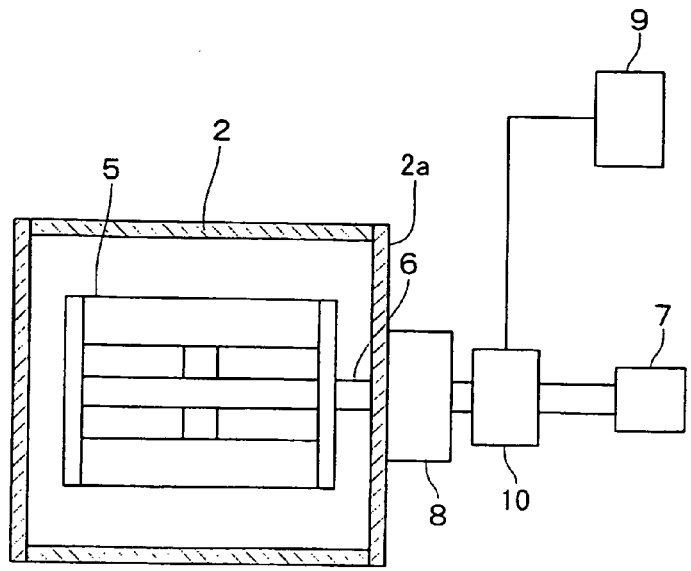
FIG. 2 is a schematic structural view to show a film forming chamber of a thin film forming apparatus of the first embodiment according to the present invention.

In the film forming chamber 2, a regular polygonal (regular octagon in this embodiment) and tubular carousel type substrate holder (hereinafter, referred to as "drum type substrate holder") 5 is installed in a posture where the central axis of the drum type substrate holder 5 is horizontally disposed, and the drum type substrate holder 5, as shown in FIG. 1 and FIG. 2, is supported rotatably about a rotating shaft 6 which is provided in a horizontal direction, and is spaced from a surface below. The rotating shaft 6 is coupled to a driving motor 7 at an end opposite to the drum type substrate holder 5 to drive the drum type substrate holder 5 to rotate.

Between a side surface 2a of the film forming chamber 2 through which the rotating shaft 6 is put and the driving motor 7, there are provided a vacuum sealing mechanism 8 and a bias introducing mechanism (such as a metallic brush, a capacitor coupling) 10 to apply a bias voltage from a bias electrode 9 to the drum type substrate holder 5. The vacuum sealing mechanism 8, the bias introducing mechanism 10, and the driving motor 7 are installed in a storage container 11 which is connected to the side surface 2a of the film forming chamber 2.

Figure 3:
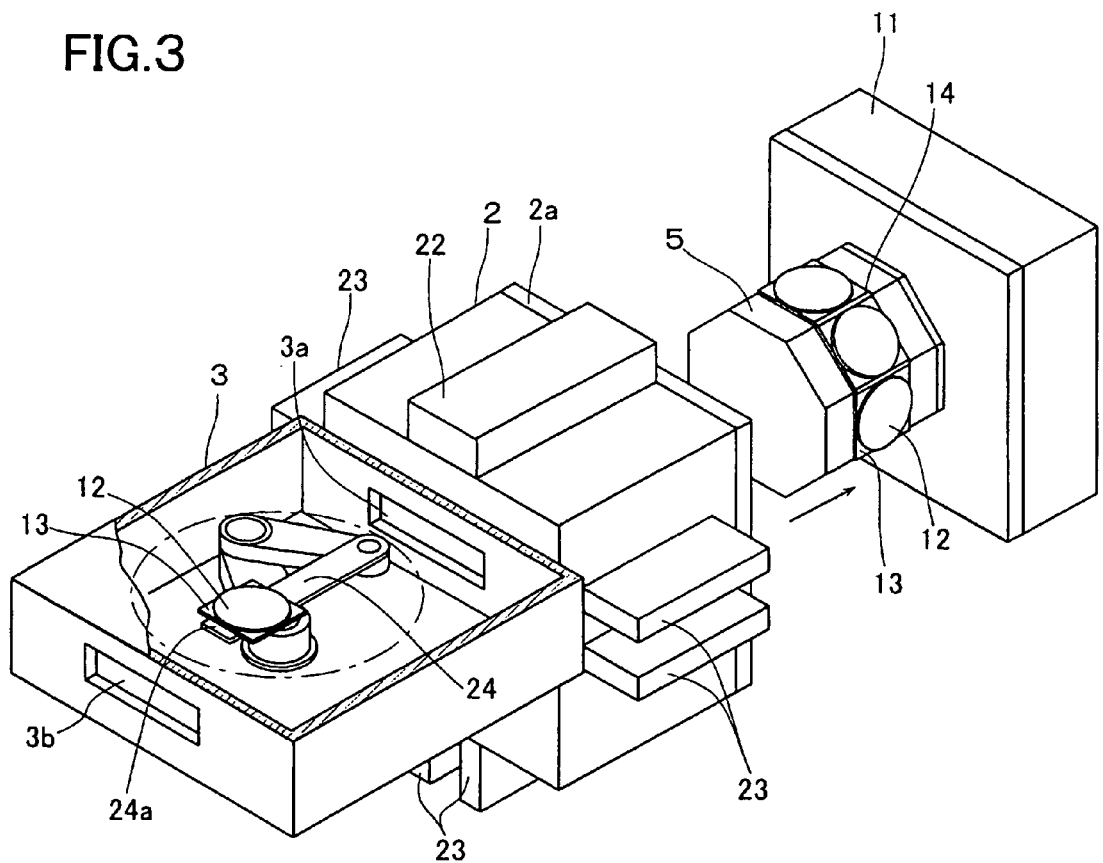
FIG. 3 is a partially cutaway perspective view to show a drum type substrate holder of a thin film forming apparatus of the first embodiment according to the present invention, with the drum type substrate holder being pulled out.

The drum type substrate holder 5 in the film forming chamber 2 can be, as shown in FIG. 3, pulled out in a horizontal direction integrally with the storage container 11 in which the vacuum sealing mechanism 8 connected to the side surface 2a of the film forming chamber 2, the bias introducing mechanism 10, and the driving motor 7 are installed, and this makes regular maintenance works on the inside of the film forming chamber 2 and the drum type substrate holder 5 be done easily.

The storage container 11 can move easily in a horizontal direction when provided with a guide rail (not shown) to move along.

Thus, the drum type substrate holder 5 which is installed integrally with the storage container 11 can be pulled out easily by moving the storage container 11, and maintenance works on it can be done easily.

The storage container 11 includes a door to make maintenance works on the vacuum sealing mechanism 8, bias introducing mechanism 10, and the driving motor 7 can be done easily.

Figure 4:
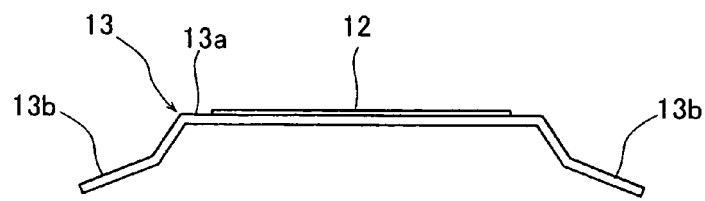
FIG. 4 is a front elevational view to show a substrate fixing jig of a thin film forming apparatus of the first embodiment according to the present invention.
Figure 5:
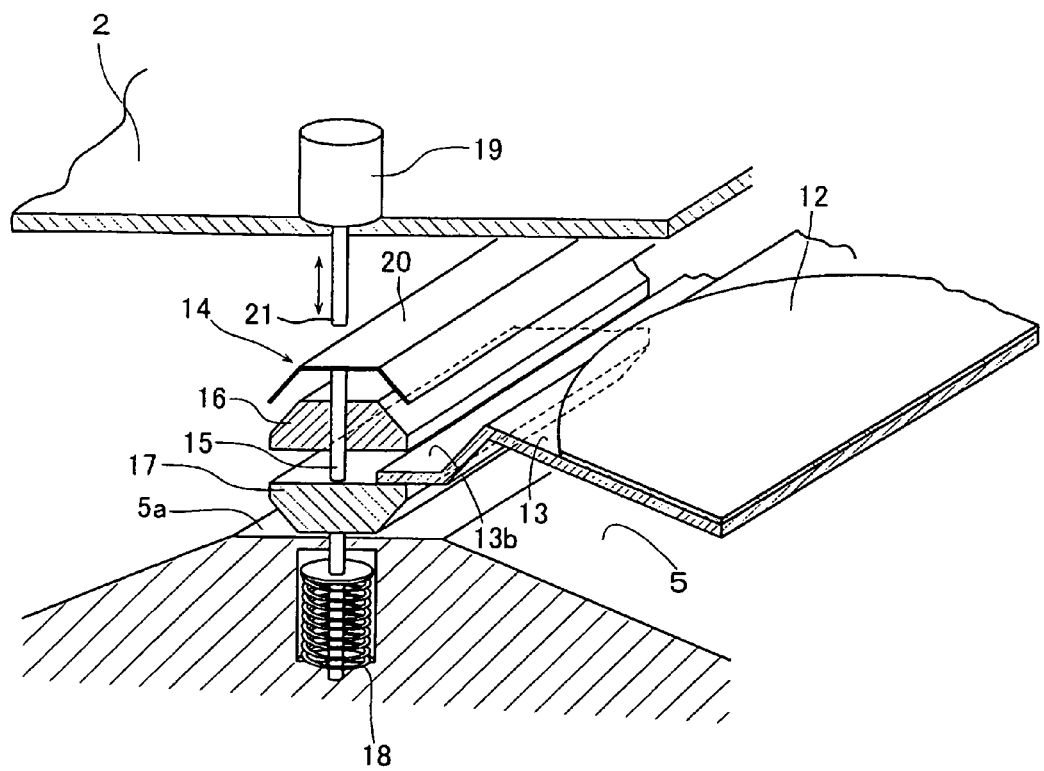
FIG. 5 is a perspective view to show a securing device of a thin film forming apparatus of the first embodiment according to the present invention.

On each of the plurality of outer circumferential surfaces of the drum type substrate holder 5, as shown in FIG. 5, a substrate fixing jig 13 fixedly holding a substrate 12 (see FIG. 4) is releasably secured by securing devices 14 each of which is provided on a corner part 5a of each outer circumferential surface (which will be explained in detail below). The substrate fixing jig 13 is, as shown in FIG. 4, bent outwardly to provide a middle substrate fixing section 13a where a substrate 12 is fixedly held and end parts 13b on both sides of the section 13a, and to make the middle substrate fixing section 13a raised above the end parts 13b.

This configuration produces a gap between the drum type substrate holder 5 and the substrate fixing jig 13 when the substrate fixing jig 13 is mounted to the drum type substrate holder 5. Into the gap, a substrate hand section 24a of an arm 24 can be inserted.

The securing devices 14 which is provided on the corner parts 5a between each outer circumferential surfaces of the drum type substrate holder 5 are facing upward in FIG. 5, however, when the securing devices 14 is released and the substrate fixing jig 13 is transferred to and from, as shown in FIG. 1, the drum type substrate holder 5 is consistently kept in a horizontal posture so that one of the outer circumferential surfaces of the drum type substrate holder 5 faces to the top surface of the film forming chamber 2 and the securing devices 14 on the corner parts face in an obliquely upward direction.

The securing device 14 includes a plurality of vertically movable shafts 15 which are provided in the corner part 5a of each surfaces of the drum type substrate holder 5 at a predetermined distance along the longitudinal direction of the outer surfaces of the drum type substrate holder 5, a pair of an upper securing member 16 and a lower securing member 17 to sandwich and secure the end parts 13 of the substrate fixing jig 13, a spring 18 to keep biasing each shaft 15 upward, a cylinder drive unit 19 which is provided on the top surface of the film forming chamber 2 to release the end parts 13b of the substrate fixing jig 13 from the securing by the upper securing member 16 and the lower securing member 17, and a hold-down plate 20 which is fixedly attached to the upper end of each shaft 15 along the longitudinal direction of the drum type substrate holder 5.

The spring 18 is retaining means, and may be various elastic bodies other than a spring.

The upper securing member 16 has two ends in the longitudinal direction thereof which are aligned with both end faces of the drum type substrate holder 5, and is installed along the longitudinal direction of the drum type substrate holder 5 providing a predetermined gap above the corner part 5a of each surfaces of the drum type substrate holder 5. The upper securing member 16 is provided with a through-hole into which the shaft 15 is movably inserted vertically.

The lower securing member 17 is fixedly attached to the penetrating shaft 15 opposing to the upper securing member 16, and vertically moves integrally with the shaft 15 against the upper securing member 16.

Also, since the hold-down plate 20 is provided at the upper end of each shaft 15, the hold-down plate 20 as well as the lower securing member 17 and the shaft 15 move vertically.

The cylinder drive unit 19 is mounted above hold-down plate 20 on the top surface of the film forming chamber 2 at a predetermined distance along in the longitudinal direction, so that it releases the securing devices 14 on both sides of the substrate fixing jig 13 when the substrate fixing jig 13 comes into a transfer to-and-from position.

The cylinder drive unit 19 includes an extendable and retractable hold-down shaft 21, and the hold-down shaft 21 can be extended or retracted by the driving of the cylinder drive unit 19 which is controlled by an electric signal.

The extended hold-down shaft 21 contacts and presses the hold-down plate 20 at the distal end of the shaft 21 to push the shaft 15 downward.

The spring 18 is installed under a corner part 5a of each surface of the drum type substrate holder 5 to push the shaft 15 and the lower securing member 17 upward.

The pushing of the hold-down plate 20 downward by the extended hold-down shaft 21 causes the lower securing member 17 to be pushed downward, which widens the gap between upper securing member 16 and the lower securing member 17 to release the secured condition.

The pushing of the hold-down plate 20 upward by the retracted hold-down shaft 21 reduces the gap between the upper securing member 16 and the lower securing member 17 to sandwich the end parts of the substrate fixing jig 13, which secures the substrate fixing jig 13.

While the securing device 14 is provided in the corner part 5a between each outer circumferential surfaces of the drum type substrate holder 5 in the embodiment shown in FIG. 5, the securing devices 14 may be provided in both ends of each outer circumferential surfaces of the drum type substrate holder 5.

In this case, the substrate fixing jig may be flat without the end parts shown in FIG. 4, and the both ends of the substrate fixing jig will be sandwiched in the securing device.

Also in the case of the above substrate fixing jig, the substrate itself may be secured by the securing device 14.

To transfer the substrate fixing jig to the drum type substrate holder, a guiding mechanism may be provided to guide the substrate fixing jig to the outer circumferential surface of the drum type substrate holder.

Figure 6:
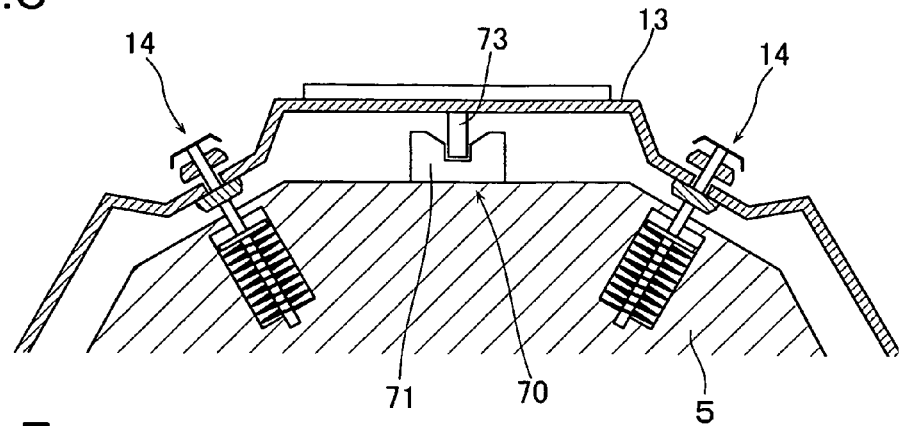
FIG. 6 is a partially schematic cross-sectional view to show a guiding mechanism.

FIG. 6 is a partially schematic cross-sectional view to show a guiding mechanism which is provided on the drum type substrate holder.

Referring to FIG. 6, guiding mechanism 70 includes a guide rail 71 on each outer circumferential surface of the drum type substrate holder 5, a projected portion 73 on the back surface of the substrate fixing jig 13, and the projected portion 73 is fit into the guide rail 71 by insertion to move smoothly.

Figure 7:
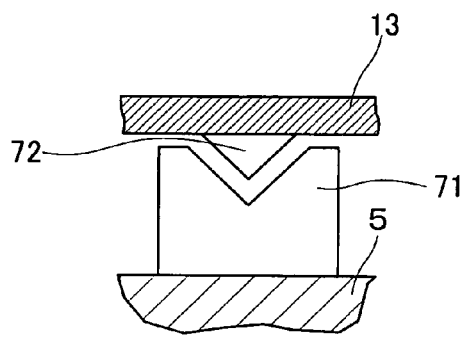
FIG. 7 is a schematic view to show a guiding mechanism of another embodiment.

The projected portion 73 in FIG. 7 has a cross-section of a rectangular shape, and the guide rail 71 is formed with a groove which has a cross-sectional shape corresponding to the rectangular shape.

The guiding mechanism, as shown in FIG. 7, includes a guide rail which has a cross-sectional shape corresponding to the triangular cross-sectional shape of the projected portion 72 on the substrate fixing jig.

Figure 8:
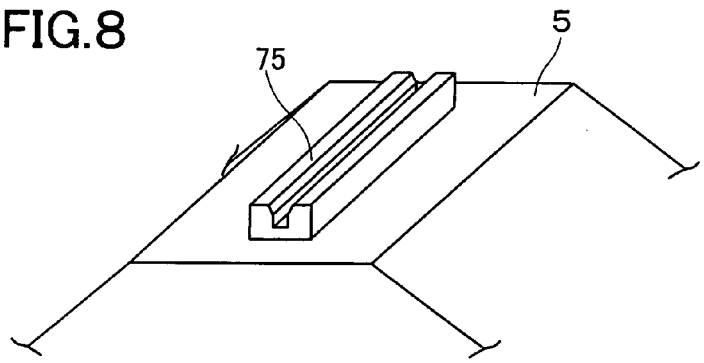
FIG. 8 is a schematic view to show a longer guide rail.
Figure 9:
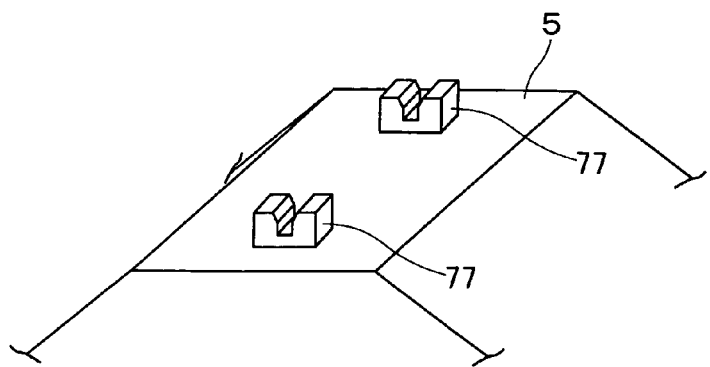
FIG. 9 is a schematic view to show a shorter guiding section.

The guide rail may include a plurality of shorter guiding section 77, such as those of FIG. 9 in addition to the longer guide rail 75, as shown in FIG. 8.

The guide mechanism may be provided on the lower securing member 17 (see FIG. 5). The guide mechanism provides a stepped portion at the position on the lower securing member 17 where the end part 13b of the substrate fixing jig 13 contacts, so that the substrate fixing jig may be smoothly inserted along the stepped portion.

The guiding mechanism with such a configuration determines the position of the substrate fixing jig which is transferred to the drum type substrate holder to prevent any movement in a lateral direction from the direction into which the substrate fixing jig inserted in the drum type substrate holder horizontally.

The film forming chamber 2 is provided with an oxidizing source 22, and a plurality of cathodes (targets) 23 along the peripheral surface of the drum type substrate holder 5. Each cathode 23 is connected to a power for sputtering (not shown) respectively. In this embodiment, the cathodes 23 are used in pairs (double cathode).

An arm 24 is pivotally mounted in the transferring chamber 3, and the arm 24 is extendable and retractable, and has a tip with a substrate hand section 24a. The arm 24 transfers the substrate fixing jig 13 which fixedly holds a substrate 12 to and from the outer circumferential surface of the drum type substrate holder 5 through an opening 3a provided with a gate valve (not shown).

The transfer surface (horizontal surface) of substrate fixing jig 13 which fixedly holds a substrate 12 to be transferred to and from by the substrate hand section 24a of the arm 24 is generally positioned onto the outer circumferential surface of the drum type substrate holder 5 facing to the top surface of the film forming chamber 2. The transferring chamber 3 has another side opposite to the side toward the film forming chamber 2, and a load/unload chamber 4 is coupled to the another side via an opening 3b provided with a gate valve (not shown).

In the load/unload chamber 4, a plurality of substrate fixing jigs 13 are movably stored in a vertical direction, each of which fixedly holds a substrate 12 with and without a formed film.

Now, a process to form a film with a thin film forming apparatus 1 according to the above described embodiment will be explained.

First, the gate valve (not shown) of the opening 3b in the transferring chamber 3 is opened so that the arm 24 is pivoted and extended into the load/unload chamber 4 to insert the substrate hand section 24a under the substrate fixing section 13a of a substrate fixing jig 13 which fixedly hold a substrate 12 without a film on it, and then the substrate fixing jig 13 is slightly lowered to rest the bottom surface of the substrate fixing section 13a on the substrate hand section 24a.

After the arm 24 is retracted in to the transferring chamber 3, the gate valve (not shown) of the opening 3b is closed and the gate valve (not shown) of the opening 3a on the opposite side is opened so that the arm 24 is pivoted and extended to transfer the substrate fixing jig 13 onto an outer circumferential surface of the drum type substrate holder 5 which is positioned to face toward the top surface of the film forming chamber 2.

In the process, the film forming chamber 2, the transferring chamber 3, and the load/unload chamber 4 are adjusted to a predetermined pressure by evacuation.

In transferring, each shaft 15 of the securing devices 14 in the both corner parts 5a of a surface of the drum type substrate holder 5 in the transferring to/from position are, as shown in FIG. 5, pushed downward by the pressure applied to hold-down plate 20 by the hold-down shaft 21 to provide a gap between the upper securing member 16 and the lower securing member 17.

With the a gap between the upper securing member 16 and the lower securing member 17 being maintained, the both end parts 13b of the substrate fixing jig 13 are inserted in an axial direction of the rotating shaft.

Then, in the securing device 14, the retracted hold-down shaft 21 by the driving of the cylinder drive unit 19 causes the lower securing member 17 to move upward integrally with the shaft 15 by the spring force of the spring 18, so that the both end parts 13b of the substrate fixing jig 13 are sandwiched between the upper securing member 16 and the lower securing member 17 to hold the substrate fixing jig 13 on which a substrate 12 is fixedly held onto an outer circumferential surface of the drum type substrate holder 5.

After that, the substrate hand section 24a of the arm 24 is retracted back into the transferring chamber 3.

Then the driving motor 7 is driven to rotate the drum type substrate holder 5 by a predetermined angle to make the adjacent outer circumferential surface come into a position to face to the top surface of the film forming chamber 2.

Similarly, as described above, the arm 24 transfers a substrate fixing jig 13 stored in the load/unload chamber 4 with a substrate 12 being fixedly held thereon onto an outer circumferential surface of the drum type substrate holder 5 in the film forming chamber 2, so that the end parts 13b of the substrate fixing jig 13 are sandwiched between the upper securing member 16 and the lower securing member 17 of each securing device 14 provided on the corner on both sides to hold the substrate fixing jig 13 on which the substrate 12 is fixedly held onto the outer circumferential surface of the drum type substrate holder 5.

Subsequently in the same way, the substrate fixing jig 13 on which a substrate 12 is fixedly held is held on each outer circumferential surfaces (8 surfaces in this embodiment) of the drum type substrate holder 5.

Next, the gate valve of the opening 3a is closed to adjust the inside of the film forming chamber 2 to a predetermined pressure and introduce $O_2$ gas from an oxidizing source 22 and also argon gas from each gas supplying port (not shown) provided near to each cathode (target) 23 into the film forming chamber 2, and each cathode (target) 23 is applied with a high-frequency voltage so that plasma is generated by an electrical discharge.

Each cathode (target) 23 which is placed around the drum type substrate holder 5 may be a Si cathode or a Ti cathode, for example.

During the plasma generation, the drum type substrate holder 5 is rotated at a predetermined rotation speed by the driven driving motor 7 to form a multi-layered film, such as a $SiO_2$ film, and a $TiO_2$ film with a predetermined thickness respectively on each substrate 12 which is held on each substrate fixing jig 13.

The drum type substrate holder 5 is applied with a predetermined bias voltage by the bias electrode 9 via the bias introducing mechanism 10.

When the process to form a thin film on each substrate 12 is completed, the gate valve (not shown) of the opening 3a is opened to transfer the substrate hand section 24a of the arm 24 into the film forming chamber 2 to insert the substrate hand section 24a under the substrate fixing jig 13 which is held on the outer circumferential surface of the drum type substrate holder 5.

The cylinder drive unit 19 is driven to extend the hold-down shaft 21 downward to push down the hold-down plate 20. The pushing down causes the shaft 15 and the lower securing member 17 to be lowered integrally to release the ends parts 13b of the substrate fixing jig 13 from the sandwiched condition and rest the substrate fixing jig 13 on the substrate hand section 24a.

After the substrate hand section 24a on which the substrate fixing jig 13 fixedly holding a substrate 12 with a formed film is rested is retracted back into the transferring chamber 3, the gate valve (not shown) of the opening 3a is closed and the gate valve (not shown) of the opening 3b on the opposite side is opened so that the arm 24 is pivoted and extended to transfer the substrate fixing jig 13 fixedly holding a substrate 12 with a formed film into the load/unload chamber 4 for storage.

The cylinder drive unit 19 is driven to rotate the drum type substrate holder 5 by a predetermined angle, to make the adjacent outer circumferential surface come into a position to face to the top surface of the film forming chamber 2, and after a film is formed onto the substrate 12 held on this outer circumferential surface, the substrate fixing jig 13 which fixedly holds the substrate 12 with a formed film is transferred into the load/unload chamber 4 for storage, as in the way described above.

Subsequently in the same way, the substrate fixing jig 13 fixedly holding a substrate 12 with a formed film which is held on each outer circumferential surfaces of the drum type substrate holder 5 is transferred back into the load/unload chamber 4 for storage by the arm 24.

Next, an taking-out port (not shown) of the load/unload chamber 4 is opened to take out each substrate 12 with a formed film on it which has been stored inside under atmospheric pressure, together with the substrate fixing jig 13.

In this way, in this embodiment, supporting the regular polygonal (regular octagonal shape in this embodiment) and tubular drum type substrate holder 5 rotatably about the horizontal rotating shaft 6 in the film forming chamber 2 in a horizontal posture allows to the substrate fixing jig 13 fixedly holding a substrate 12 to be transferred by the arm 24 horizontally onto an outer circumferential surface of the drum type substrate holder 5.

Due to the securing devices 14 provided in the corner parts 5a of an outer circumferential surface of the drum type substrate holder 5 which secure the end parts 13b of the substrate fixing jig 13, the substrate fixing jig 13 fixedly holding a substrate 12 can be held onto an outer circumferential surface of the drum type substrate holder 5.

In addition, the substrate fixing jig 13 can be pulled out from the film forming chamber 2 with a horizontal movement of the arm 24 only after the securing by the securing device 14 is released after a film is formed, which makes the transferring of the substrate fixing jig 13 fixedly holding a substrate 12 to and from an outer circumferential surface of the drum type substrate holder 5 more simple, and allows the transferring of the substrate fixing jig 13 fixedly holding a substrate 12 to and from an outer circumferential surface of the drum type substrate holder 5 to be performed in a shorter period of time with an improved working efficiency.

The substrate fixing jig 13 fixedly holding a substrate 12 can be mechanically transferred to and from an outer circumferential surface of the drum type substrate holder 5 in vacuum, instead of under atmospheric pressure, which shortens the time required for the film forming process.

And also, it prevents the contamination of the substrates.

While one substrate 12 having a large diameter is fixedly held on the substrate fixing jig 13 in the above embodiment, a plurality of substrates having a smaller diameter may be fixedly held on the substrate fixing jig 13.

Figure 10:
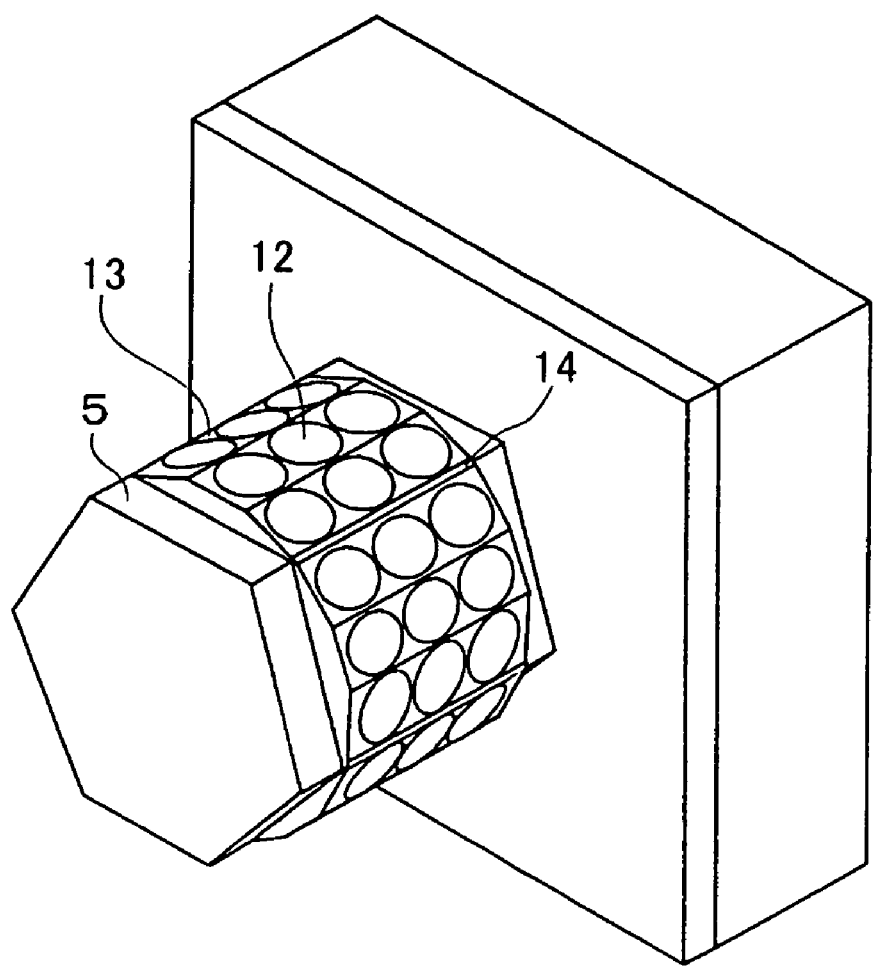
FIG. 10 is a schematic perspective view to show a modified substrate fixing jig of the first embodiment according to the present invention where a plurality of substrates are fixedly held on each surface of drum type substrate holder.

For example, as shown in FIG. 10, the surface of each substrate fixing jig 13 may be divided into three parts along the longitudinal direction to hold a plurality of substrates 12 having a smaller diameter on each part (three substrates 12 are held on each part of one substrate fixing jig 13, which means 9 substrates in total for one substrate fixing jig 13, in FIG. 10).

The drum type substrate holder 5 is formed into a regular hexagonal and tubular shape in the above case.

Also, while the drum type substrate holder 5 is a regular octagonal and tubular shape in the above embodiment (a regular hexagonal and tubular shape in FIG. 10), but not limited to these, the drum type substrate holder 5 with other shapes including other polygonal and tubular shapes and cylindrical and tubular shapes may be applied to the present invention.

Such a mechanism in this embodiment in which the drum type substrate holder 5 has a spring 18 and also the securing device 15 can be released by a unit above the forming chamber 2 is preferable for a case where the drum type substrate holder 5 is applied with bias, because the drum type substrate holder 5 is not provided with an electrical device.

Besides, in the above embodiment, the substrate fixing jig 13 can be transferred in a horizontal direction because the drum type substrate holder 5 rotates in a horizontal posture. This eliminates the necessity of holding the substrate fixing jig 13 in transferring, and makes the configuration of the transferring device, such as the arm 24 more simple.

Moreover, in the above embodiment, the substrate fixing jig 13 is transferred parallel to the rotating shaft of the drum type substrate holder 5, which does not disturb the outer area which is opposite to the drum type substrate holder 5 and available to install the film forming means and the like.

If an opening 3a is able to be formed in the outer area, the substrate fixing jig 13 can be transferred in a direction parallel to the top surface of the drum type substrate holder 5 and also in a horizontal direction against the vertical direction of the rotating shaft.

The storage container 11 which is opposite to the opening 3a may have an opening, and another transferring chamber and another arm may be located outside of the opening to perform the transferring to/from of the substrate fixing jig 13 with the another arm.

While a sputtering film forming means with targets 23 is used as film forming means in the above embodiment, other film forming means, such as deposition film forming means and CVD film forming means may be installed in addition to the sputtering film forming means.

Besides the oxidizing source 5 to oxidize a film by supplying a gas containing oxygen atoms including oxygen, reaction gas supplying means to form a compound film by supplying other reaction gas, reactivity improving means to improve the reactivity of a film by exposing plasma, radicals or ions, and etching means to etch a portion of a film by irradiating plasma or ions may be provided.

The apparatus having a combination of two or more film forming means, reaction gas supplying means, reactivity improving means, etching means is also included in the present invention.

The substrate is held by the substrate fixing jig 13 for transferring and securing in the above embodiment, however, a substrate with a shape which can be lifted or held by the substrate hand section 24a of the arm 24 may be directly transferred and secured.

Specifically, a recess may be formed in the outer surface of the drum type substrate holder 5 so that the substrate hand section 24a of the arm 24 can be inserted between the substrate and the drum type substrate holder 5.

In another embodiment, a push-up pin with an elastic body may be provided to the surface of the drum type substrate holder 5 to push up a substrate when it is not sandwiched by securing means (when it is not pushed down).

In the above embodiment, when several to several hundreds of multi-layered films are formed on substrates, because the drum type substrate holder 5 on which substrates are held is rotated several times and the substrates need to be exchanged after the film is formed, which is different from the case to form a one-layer film by passing a film and the like, the substrate exchanging performed automatically and in a depressurized atmosphere as in the above embodiment, is especially preferable to improve productivity.

Embodiment 2

Figure 11:
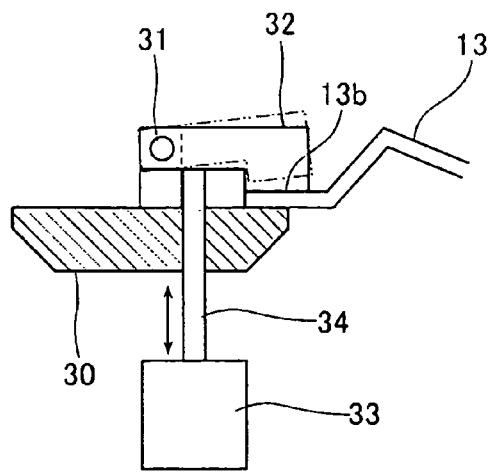
FIG. 11 is a schematic cross-sectional view to show a securing device of a thin film forming apparatus of a second embodiment according to the present invention.

A securing device of this embodiment, as shown in FIG. 11, has a configuration in which an upper securing member 32 that is openable and closable about a rotating shaft 31 of biasing means is mounted to an upper surface of a lower securing member 30 that is secured above a corner part of each outer circumferential surface of a drum type substrate holder (not shown), and a tip portion of an extendable and retractable cylinder 34 of a cylinder drive unit 33 is swingably coupled to the upper securing member 32, the cylinder drive unit 33 being provided in a corner part of each outer circumferential surface of the drum type substrate holder.

In FIG. 11, although only the upper securing member 32 of the right side is shown, similarly, an openable and closable upper securing member which is coupled to the cylinder is mounted to the left side of the upper surface of the lower securing member 30. The other configuration of this embodiment is the same as that of the embodiment 1.

In this embodiment, the end parts 13b of a substrate fixing jig 13 fixedly holding a substrate (not shown) are transferred by an arm (not shown) as in the embodiment 1 into between the upper securing member 32 and the lower securing member 30 which are separated by the extended cylinder 34.

The cylinder drive unit 33 is driven to retract the cylinder 34, which causes the upper securing member 32 to move to be closed so that the end parts 13b of a substrate fixing jig 13 are sandwiched between the upper securing member 32 and the lower securing member 30, and the substrate fixing jig 13 fixedly holding a substrate is securely held onto an outer circumferential surface of the drum type substrate holder.

In order to release the substrate fixing jig 13 fixedly holding a substrate from the securedly holding, the cylinder drive unit 30 is driven to extend the cylinder 34, which causes the upper securing member 32 to move to be opened.

This embodiment gives a similar effect as in the embodiment 1.

The securing device of this embodiment does not include securing and releasing means mounted to an outer area, which is useful when securing and releasing means cannot be mounted to the outer vacuum container in the outer area.

Embodiment 3

Figure 12:
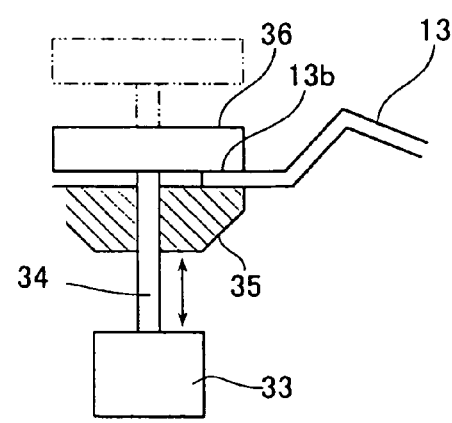
FIG. 12 is a schematic cross-sectional view to show a securing device of a thin film forming apparatus of a third embodiment according to the present invention.

A securing device of this embodiment, as shown in FIG. 12, has a configuration in which an upper securing member 36 is mounted above a lower securing member 35 that is secured above a corner part of each outer circumferential surface of a drum type substrate holder (not shown), and a tip portion of an extendable and retractable cylinder 34 of a cylinder drive unit 33 is coupled to the upper securing member 36, the cylinder drive unit 33 being provided in a corner part of each outer circumferential surface of the drum type substrate holder.

The cylinder 34 is coupled to the upper securing member 36 through an aperture formed in the lower securing member 35. The other configuration of this embodiment is the same as that of the embodiment 1.

In this embodiment, the end parts 13b of a substrate fixing jig 13 fixedly holding a substrate (not shown) are transferred by an arm (not shown) as in the embodiment 1 into between the upper securing member 36 and the lower securing member 35 which are separated by the extended cylinder 34, and then, the cylinder drive unit 33 is driven to retract the cylinder 34, which causes the upper securing member 36 to move downward so that the end parts 13b of a substrate fixing jig 13 are sandwiched between the upper securing member 36 and the lower securing member 35, and the substrate fixing jig 13 fixedly holding a substrate is securely held onto an outer circumferential surface of the drum type substrate holder.

In order to release the substrate fixing jig 13 fixedly holding a substrate from the securedly holding, the cylinder drive unit 33 is driven to extend the cylinder 34 to cause the upper securing member 36 to be moved upward. This embodiment also gives a similar effect as in the embodiment 1.

Embodiment 4

Figure 13:
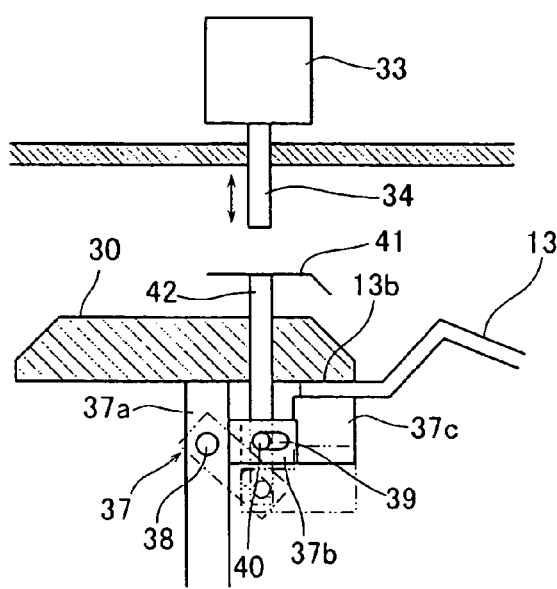
FIG. 13 is a schematic cross-sectional view to show a securing device of a thin film forming apparatus of a fourth embodiment according to the present invention.

A securing device of this embodiment, as shown in FIG. 13, has a configuration in which an lower securing member 37 is mounted to a lower surface of an upper securing member 36 that is secured above a corner part of each outer circumferential surface of a drum type substrate holder (not shown), and a cylinder drive unit 33 that has an extendable and retractable cylinder 34 is provided to the top surface of the film forming chamber 2.

The lower securing member 37 includes first supporting member 37a which is secured between the upper securing member 36 and the drum type substrate holder (not shown), a second supporting member 37b which is rotatably connected to the first supporting member 37a via a rotating shaft 38, and a third supporting member 37c which is swingably connected to the second supporting member 37b via a pin 40 inserted through a long hole 39, and the third supporting member 37c has a shaft 42 with a tip portion thereof to which a hold-down plate 41 is fixed so that the shaft 42 is positioned below the cylinder 34 of the cylinder drive unit 33.

The shaft 42 is movably inserted through an aperture formed in the upper securing member 36.

To the third supporting member 37c, biasing means (not shown) which continuously biases upward is connected.

Specifically, an elastic body, such as a leaf spring presses the third supporting member 37c against the upper securing member 36. The other configuration of this embodiment is the same as that of the embodiment 1.

In this embodiment, the extended cylinder 34 by the driven cylinder drive unit 33 causes the hold-down plate 41 to be pressed, which results in that the shaft 42 is pushed downward, as shown in a chain double-dashed line, to move the third supporting member 37c downward, so that the end parts 13b of the substrate fixing jig 13 fixedly holding a substrate (not shown) is transferred by an arm (not shown), as in the embodiment 1, into the opened space between the upper securing member 36 and the third supporting member 37c of the lower securing member 37.

Next, the cylinder drive unit 33 is driven to retract the cylinder 34, and the third supporting member 37c is moved upward by the biasing force of biasing means (not shown) so that the end parts 13b of the substrate fixing jig 13 is sandwiched between the upper securing member 36 and the third supporting member 37c of the lower securing member 37 to securedly hold the substrate fixing jig 13 fixedly holding a substrate onto an outer circumferential surface of the drum type substrate holder 5.

In order to release the substrate fixing jig 13 fixedly holding a substrate from the securedly holding, the cylinder drive unit 33 is driven to extend the cylinder 34 to cause the shaft 42 to be lowered by the pressed hold-down plate 41, as shown in a chain double-dashed line, so that the third supporting member 37c moves downward. This embodiment also gives a similar effect as in the embodiment 1.

Embodiment 5

Figure 14:
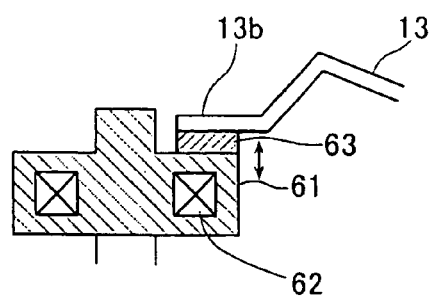
FIG. 14 is a schematic cross-sectional view to show a securing device of a thin film forming apparatus of a fifth embodiment according to the present invention.

A securing device of this embodiment, as shown in FIG. 14, has a configuration in which an electromagnet 62 is embedded in a lower securing member 61 that is secured above a corner part of each outer circumferential surface of a drum type substrate holder (not shown), and a magnetic plate 63 is fixedly attached on the lower surface of the end parts 13b of the substrate fixing jig 13 that is rested on the lower securing member 61. The state of generated magnetic force in the electromagnet 62 is switched between operative and inoperative by ON/OFF of external electric signals.

In this embodiment, the substrate fixing jig 13 fixedly holding a substrate (not shown) is transferred by an arm (not shown) onto an outer circumferential surface of the drum type substrate holder (not shown), and after the end parts 13b of the substrate fixing jig 13 are rested on the lower securing member 61, the arm (not shown) is pulled out.

Next, the electromagnet 62 is turned on to make its magnetic force operative, so that the end parts 13 of the substrate fixing jig 13 are secured on the lower securing member 61 by the magnetic force to fixedly hold the substrate fixing jig 13 onto an outer circumferential surface of the drum type substrate holder (not shown).

In order to release the substrate fixing jig 13 from the securedly holding, after the arm (not shown) is inserted under the substrate fixing jig 13, the electromagnet 62 is turned off to make its magnetic force inoperative, so that the end part 13b of the substrate fixing jig 13 is released from securing by magnetic force, and then the arm (not shown) inserted under the substrate fixing jig 13 is pulled out to transfer the substrate fixing jig 13.

This embodiment also gives a similar effect as in the embodiment 1.

Embodiment 6

Figure 15:
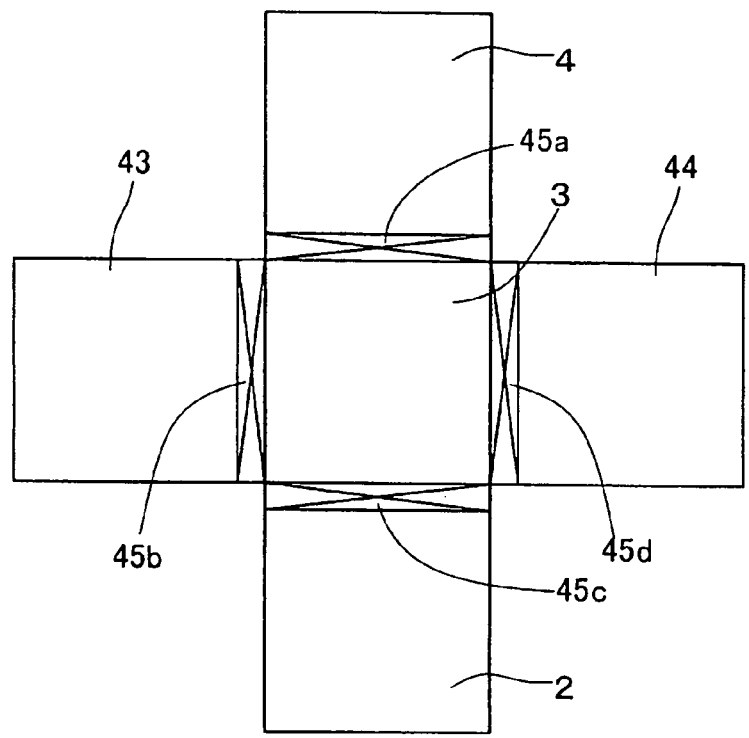
FIG. 15 is a schematic plane view to show a thin film forming apparatus of a sixth embodiment according to the present invention.

In this embodiment, the thin film forming apparatus according to the present invention is applied to a multi-chamber (plural chamber) type single substrate processing apparatus to form a film by sputtering, and, as shown in FIG. 15, a transferring chamber 3 is centrally provided around which a load/unload chamber 4, a preheating chamber 43, a film forming chamber 2, a substrate cooling chamber 44 are installed via a gate valve 45a, 45b, 45c, 45d respectively. In the preheating chamber 43, a substrate without a film is preheated, and in the substrate cooling chamber 44, a substrate with a film is cooled. The configurations of the transferring chamber 3, the load/unload chamber 4, and the film forming chamber 2 are similar to those in embodiment 1 shown in FIG. 1 to FIG. 5 and so these will not be discussed or illustrated in detail herein. A plurality of film forming chambers 2 may be installed.

A multi-chamber type single substrate processing apparatus to form a film by sputtering, such as that in this embodiment also gives a similar effect as in the embodiment 1 when the present invention is applied to.

Embodiment 7

Figure 16:
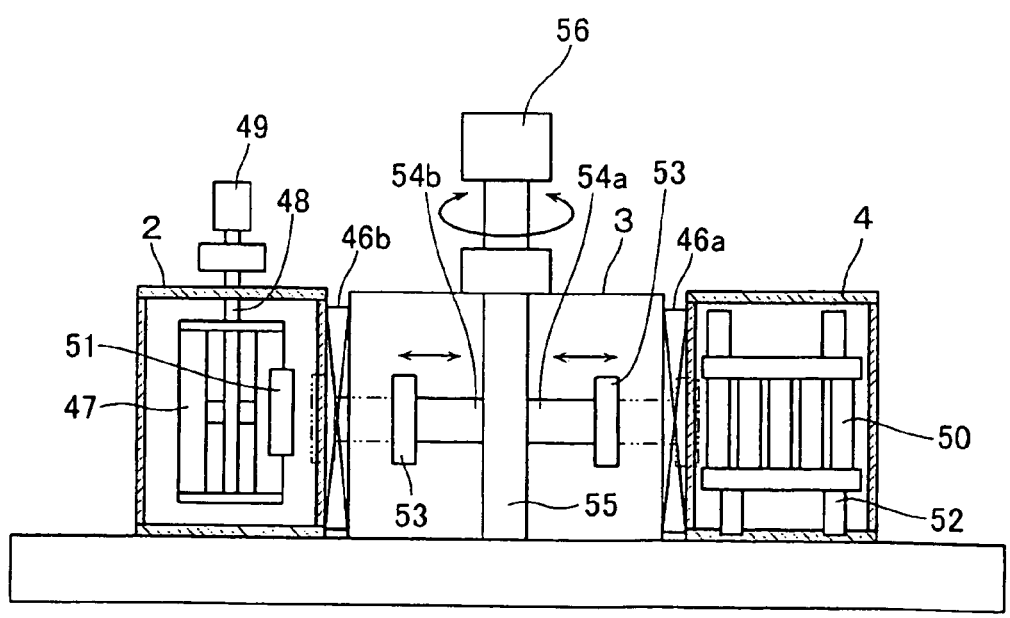
FIG. 16 is a schematic cross-sectional view to show a thin film forming apparatus of the seventh embodiment according to the present invention.

FIG. 16 is a schematic cross-sectional view to show a thin film forming apparatus according to the present invention, which includes a transferring chamber 3 to both sides of which a load/unload chamber 4 and a film forming chamber 2 are coupled via gate valves 46a and 46b respectively.

The film forming chamber 2 includes therein a regular polygonal and tubular drum type substrate holder 47 with its longitudinal axis in a vertical direction, and the drum type substrate holder 47 is supported rotatably about a rotating shaft 48 in the vertical direction. The top end of the rotating shaft 48 is coupled to a driving motor 49 to rotatably drive the drum type substrate holder 47. The drum type substrate holder 47 has outer circumferential surfaces on which a securing member 51 is provided respectively to securedly hold a substrate fixing jig 50 that fixedly holds a substrate (not shown). In the film forming chamber 2, an oxidizing source (not shown), a cathode (not shown) and the like are provided along the peripheral surface of the drum type substrate holder 47.

The load/unload chamber 4 includes a plurality of substrate fixing jigs 50 which fixedly holds a substrate respectively and are removably held in a holding device 52. The transferring chamber 3 includes two holding members 53 to removably hold a substrate fixing jig 50 fixedly holding a substrate, two cylinders 54a and 54b having a tip respectively to which each holding member 53 is fixedly attached, and a rotating shaft 55 to which the cylinders 54a and 54b are mounted. The rotating shaft 55 is rotatably supported in a vertical direction. The top end of the rotating shaft 55 is coupled to a driving motor 56. The cylinders 54a and 54b are arranged in a horizontal posture in a straight line.

In the thin film forming apparatus according to this embodiment, a gate valve 46a is opened after the film forming chamber 2, the transferring chamber 3, and the load/unload chamber 4 are evacuated and adjusted to a predetermined pressure, and after the cylinder 54a is extended in a horizontal direction to hold a substrate fixing jig 50 fixedly holding a substrate in the load/unload chamber 4 with a holding member 53, the cylinder 54a is retracted into the transferring chamber 3.

Next, the driving motor 56 is driven to rotate the rotating shaft 55 by 180 degrees to position the cylinder 54a on the side toward the film forming chamber 2. Then a gate valve 46b is opened so that the cylinder 54a is extended in a horizontal direction to transfer the substrate fixing jig 50 fixedly holding a substrate into the film forming chamber 2 and secure the substrate fixing jig 50 fixedly holding a substrate onto the securing member 51 provided on an outer circumferential surface of the drum type substrate holder 47. Subsequently in the same way, the substrate fixing jigs 50 each of which fixedly holds a substrate are secured onto the securing members 51 provided on the outer circumferential surfaces of the drum type substrate holder 47.

After the gate valve 46b is closed, the driving motor 49 is driven to rotate the drum type substrate holder 47, so that a multi-layered film forming process is performed on each substrate as described in Embodiment 1.

Once the film forming process is completed, the gate valve 46b is opened so that the cylinder 54a is extended into the film forming chamber 2 to hold the substrate fixing jig 50 fixedly holding a substrate with a formed film with the holding member 53.

After the cylinder 54a is retracted into the transferring chamber 3, the rotating shaft 55 is rotated by 180 degrees to position the cylinder 54a on the side toward the load/unload chamber 4. Then the gate valve 46a is opened so that the cylinder 54a is extended in a horizontal direction to transfer the substrate fixing jig 50 fixedly holding a substrate with a formed film into the load/unload chamber 4, and fix and store the substrate fixing jig 50 fixedly holding a substrate with a formed film in the holding device 52.

An taking-out port (not shown) of the load/unload chamber 4 is opened to take out each substrate with a formed film which is stored inside under atmospheric pressure, together with the substrate fixing jig 50.

To hold and secure the substrate fixing jig 50 with the holding member 53 and the securing member 51, for example, mechanically sandwiching means, and electromagnetically holding and releasing means for the substrate fixing jig 50 formed of a strong magnetic body may be used.

The substrate fixing jig 50 can be inserted in a direction parallel to the transfer by the holding device 53 and in a direction tangent to the drum type substrate holder 47. This makes the size of the opening of the gate valve 46b smaller.

Further, when the substrate fixing jig 50 is inserted along the outer surface of the drum type substrate holder 47, the substrate can be secured to the drum type substrate holder 47 by being sandwiched between the upper portion and the lower portion of the substrate fixing jig 50.

In this way, the thin film forming apparatus according to this embodiment also gives a similar effect as in the embodiment 1.

That is, the substrate fixing jig 50 fixedly holding a substrate 12 can be mechanically fix/remove to/from an outer circumferential surface of the drum type substrate holder 47 in vacuum, instead of under atmospheric pressure, which shortens the time required for the film forming process.

And also, it prevents the contamination of the substrates.

INDUSTRIAL APPLICABILITY

As described above, the thin film forming apparatus according to the present invention is extremely useful as an apparatus to fix/remove a substrate under vacuum.

The invention claimed is:

1. A thin film forming apparatus to form a thin film on each of a plurality of substrates held on an outer circumferential surface of a cylindrical substrate holder that is rotatable about a rotating shaft, while the cylindrical substrate holder is being rotated in an evacuatable chamber, the thin film forming apparatus comprising:
a transferring device that transfers one of a substrate itself or a substrate fixing jig fixedly holding a substrate or a plurality of substrates that is removeably securable onto the outer circumferential surface of the cylindrical substrate holder to/from the cylindrical substrate holder in the evacuatable chamber; and
means for releasably securing the substrate itself or the substrate fixing jig transferred by the transferring device onto the outer circumferential surface of the cylindrical substrate holder,
wherein the cylindrical substrate holder is rotatable around the rotating shaft which is provided in a horizontal direction;
wherein the transferring device is provided outside the evacuatable chamber and includes an arm insertable into a gap between the cylindrical substrate holder and the substrate fixing jig or the substrate itself;
wherein the arm, when holding the substrate fixing jig or the substrate itself, is transferred along the outer circumferential surface of the cylindrical substrate holder in a direction parallel with the rotating shaft,
wherein an end of one of the substrate fixing jig or the substrate itself, which is transferable by the transferring device, is fixable to the cylindrical substrate holder by the means for releasably securing;
wherein the substrate fixing jig comprises outwardly bent end parts, the outwardly bent end parts defining the middle substrate fixing portion for receiving the substrate and defining the gap between the substrate holder and the substrate fixing jig when the substrate fixing jig is mounted to the cylindrical substrate holder.

2. The thin film forming apparatus according to claim 1, wherein the cylindrical substrate holder is installed rotatably about a horizontal rotating shaft, and the transferring device transfers the substrate fixing jig in a horizontal direction.

3. The thin film forming apparatus according to claim 1, wherein the transferring device transfers the substrate fixing jig in an axial direction of the rotating shaft.

4. The thin film forming apparatus according to claim 1, wherein the transferring device transfers the substrate fixing jig in a direction parallel to an outer circumferential surface of the cylindrical substrate holder.

5. The thin film forming apparatus according to claim 1, wherein both the transferring to/from action by the transferring device and the securing action by the means for releasably securing are performed in a depressurized environment.

6. The thin film forming apparatus according to claim 1, wherein the releasing action by the means for releasably securing is controlled by an electrical signal.

7. The thin film forming apparatus according to claim 1, wherein the means for releasably securing has a mechanism to hold the substrate fixing jig by pressing with a retaining member, and a mechanism to release the substrate fixing jig from the holding by compressing the retaining member by one of a drive unit mounted outside of the evacuatable chamber or a drive unit mounted inside of the cylindrical substrate holder.

8. The thin film forming apparatus according to claim 1, wherein the means for releasably securing secures the substrate fixing jig by magnetic force.

9. The thin film forming apparatus according to claim 1, wherein the transferring device is installed in a transferring chamber which is connected to the evacuatable chamber via a valve, and the transferring chamber is evacuatable.

10. The thin film forming apparatus according to claim 9, further comprising a load/unload chamber which is connected to the transferring chamber via a valve, and the load/unload chamber is evacuatable.

11. The thin film forming apparatus according to claim 1, wherein the film is formed by one of sputtering, deposition, and CVD, or a combination thereof.

12. The thin film forming apparatus according to claim 1, wherein one of a reaction gas supplying device to supply a reaction gas, a plasma exposing device to expose plasma, a ion irradiating device to irradiate ions, and an etching device to etch a portion of the thin film, or a combination thereof is applicable to the thin film.

13. The thin film forming apparatus according to claim 1, wherein the means for releasably securing comprises an upper securing member and a lower securing member configured to receive an end part of the substrate fixing jig.

14. The thin film forming apparatus according to claim 1, wherein the means for releasably securing comprises a moveable shaft, and a retaining member biasing the moveable shaft.

15. The thin film forming apparatus according to claim 14, wherein the means for releasably securing comprises a hold-down plate fixedly attached to an upper end of the moveable shaft.

* * * * *